(12) United States Patent
Conti et al.

(10) Patent No.: US 8,433,084 B2
(45) Date of Patent: Apr. 30, 2013

(54) ASSEMBLY OF A CAPACITIVE ACOUSTIC TRANSDUCER OF THE MICROELECTROMECHANICAL TYPE AND PACKAGE THEREOF

(75) Inventors: Sebastiano Conti, Mistretta (IT); Benedetto Vigna, Pietrapertosa (IT); Mario Francesco Cortese, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 420 days.

(21) Appl. No.: 12/777,058

(22) Filed: May 10, 2010

(65) Prior Publication Data

US 2010/0284553 A1   Nov. 11, 2010

(30) Foreign Application Priority Data

May 11, 2009   (EP) ..................... 09425179

(51) Int. Cl.
*H04R 25/00*   (2006.01)

(52) U.S. Cl.
USPC ......................................................... 381/174

(58) Field of Classification Search .................... 381/174
See application file for complete search history.

(56) References Cited

U.S. PATENT DOCUMENTS

| | | | |
|---|---|---|---|
| 5,889,872 A | 3/1999 | Sooriakumar et al. | |
| 6,088,463 A | 7/2000 | Rombach et al. | |
| 6,437,412 B1 | 8/2002 | Higuchi et al. | |
| 6,541,832 B2 | 4/2003 | Coyle | |
| 6,732,588 B1 | 5/2004 | Mullenborn et al. | |
| 6,781,231 B2 | 8/2004 | Minervini | |
| 7,436,054 B2 | 10/2008 | Zhe | |
| 7,763,488 B2 | 7/2010 | Goodelle et al. | |
| 2004/0099918 A1 | 5/2004 | Noguchi et al. | |
| 2007/0040231 A1 | 2/2007 | Harney et al. | |
| 2009/0101998 A1* | 4/2009 | Yen et al. ................ | 257/416 |
| 2010/0164083 A1* | 7/2010 | Yim .......................... | 257/686 |

FOREIGN PATENT DOCUMENTS

| | | |
|---|---|---|
| EP | 1 577 656 A1 | 9/2005 |
| EP | 1 684 079 A9 | 7/2006 |
| JP | 2003-163998 A | 6/2003 |
| WO | 2004/068094 A2 | 8/2004 |
| WO | 2007/112743 A1 | 10/2007 |

* cited by examiner

*Primary Examiner* — Jianchun Qin
(74) *Attorney, Agent, or Firm* — Seed IP Law Group PLLC

(57) ABSTRACT

A microelectromechanical-acoustic-transducer assembly has: a first die integrating a MEMS sensing structure having a membrane, which has a first surface in fluid communication with a front chamber and a second surface, opposite to the first surface, in fluid communication with a back chamber of the microelectromechanical acoustic transducer, is able to undergo deformation as a function of incident acoustic-pressure waves, and faces a rigid electrode so as to form a variable-capacitance capacitor; a second die, integrating an electronic reading circuit operatively coupled to the MEMS sensing structure and supplying an electrical output signal as a function of the capacitive variation; and a package, housing the first die and the second die and having a base substrate with external electrical contacts. The first and second dice are stacked in the package and directly connected together mechanically and electrically; the package delimits at least one of the front and back chambers.

32 Claims, 9 Drawing Sheets

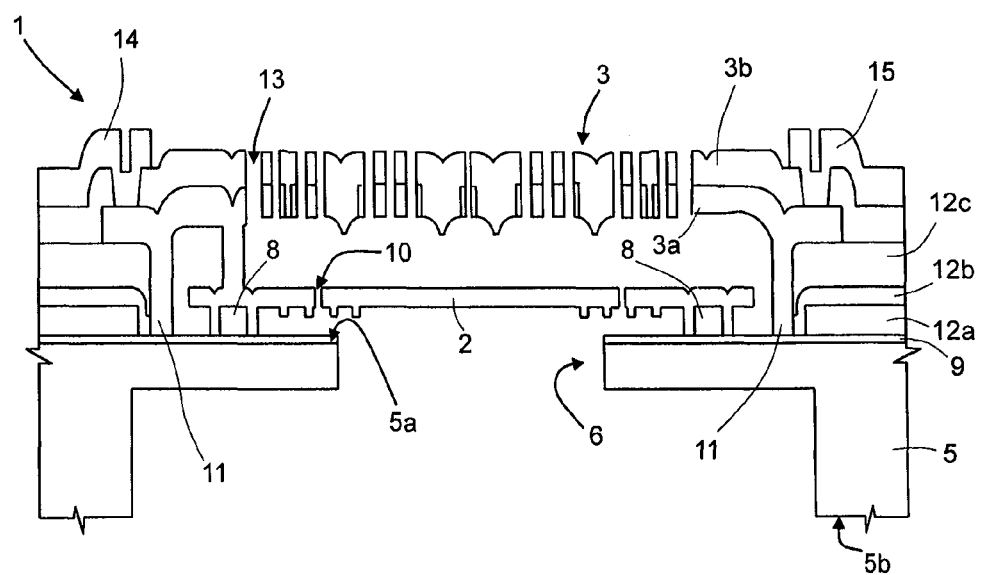
Fig.1 *(Prior Art)*
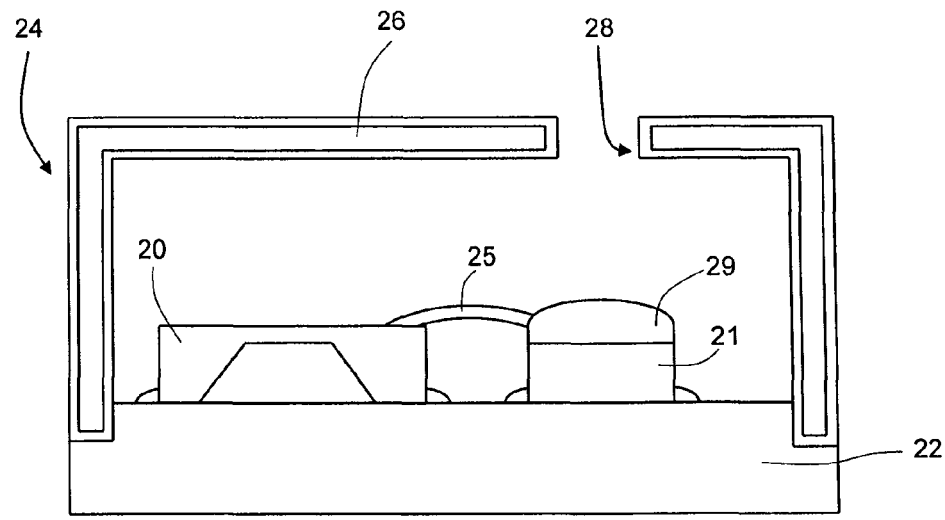
Fig.2 *(Prior Art)*

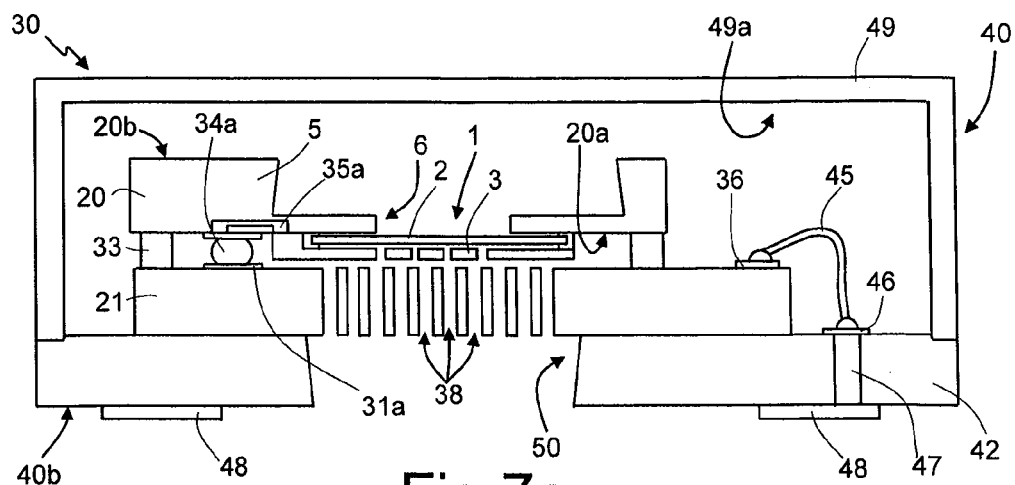
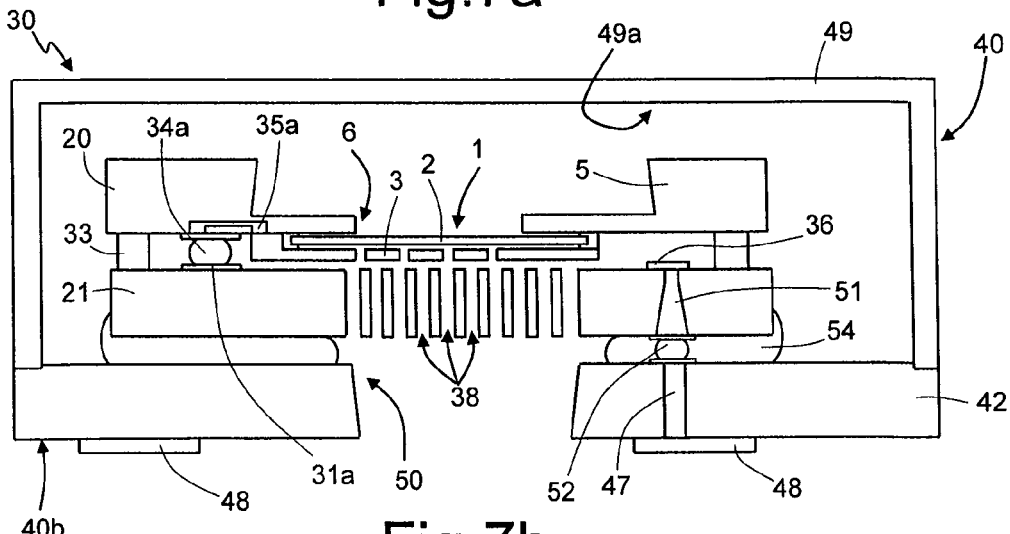
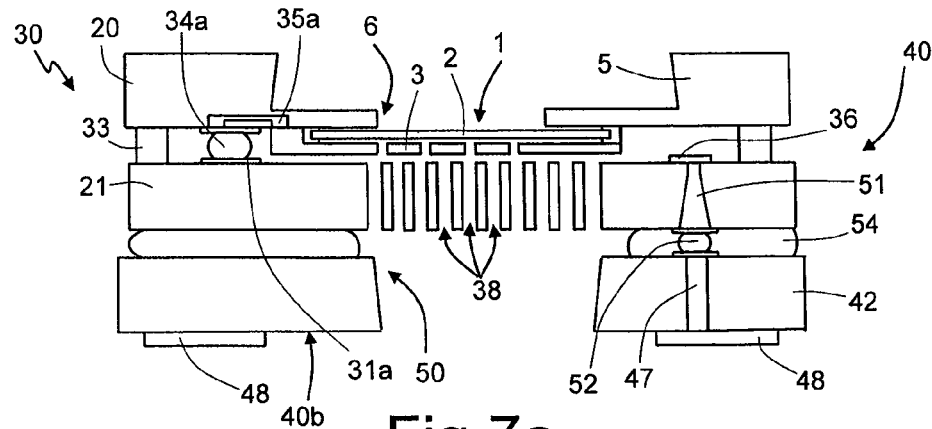

ASSEMBLY OF A CAPACITIVE ACOUSTIC TRANSDUCER OF THE MICROELECTROMECHANICAL TYPE AND PACKAGE THEREOF

BACKGROUND

1. Technical Field

The present disclosure relates to assembly of an acoustic transducer, in particular a microelectromechanical (MEMS) capacitive microphone, to which the following description will make explicit reference, without this implying any loss of generality, and to a package for the assembly thus obtained.

2. Description of the Related Art

In a manner customary in this technical field, the term "package" will be used herein to indicate the casing or coating that surrounds, totally or partially, the die or dice of semiconductor material of the acoustic transducer, enabling electrical connection thereof from outside, for example, using the surface-mount (SMD) technique.

As is known, an acoustic transducer, for example a MEMS microphone of a capacitive type, generally comprises a MEMS sensing structure, designed to transduce acoustic-pressure waves into an electrical quantity (in particular, a capacitive variation), and a reading electronics, designed to execute appropriate processing operations (amongst which operations of amplification and filtering) of this electrical quantity so as to supply an electrical output signal (for example, an electrical voltage).

The MEMS sensing structure comprises in general a mobile electrode, formed as a diaphragm or membrane, set facing a fixed electrode, for providing the plates of a variable-capacitance sensing capacitor. The mobile electrode is generally anchored, by means of a perimetral portion thereof, to a substrate, whilst a central portion thereof is free to move or bend in response to the pressure exerted by incident acoustic-pressure waves. The mobile electrode and the fixed electrode form a capacitor, and bending of the membrane that constitutes the mobile electrode causes a variation of capacitance as a function of the acoustic signal to be detected.

In greater detail and with reference to FIG. 1, in a known embodiment, a microelectromechanical sensing structure 1 of a MEMS capacitive microphone comprises a membrane 2, which is mobile, is made of conductive material, and faces a back plate 3 (where by "back plate" is understood herein an element that is relatively rigid as compared to the membrane, which is, instead, flexible). The back plate 3 is formed by a first plate layer 3a, made of conductive material and facing the membrane 2, and by a second plate layer 3b, made of insulating material, set on the first plate layer 3a except for portions in which it extends through the first plate layer 3a to form protuberances, which start from the back plate 3 as a prolongation thereof towards the membrane 2 and have anti-stiction and stopper functions in regard to the movement of the membrane.

The membrane 2, which in use undergoes deformation as a function of the incident acoustic-pressure waves, is partially suspended above a substrate 5 and set directly facing a cavity 6, obtained by etching a rear surface 5b of the substrate 5 (opposite to a front surface 5a of the same substrate 5, set in the proximity of the membrane 2); the cavity 6 is defined as "back chamber" or "rear chamber", in the case where the incident waves traverse the back plate 3 and has in this case the function of reference-pressure chamber. The membrane 2 is anchored to the substrate 5 by means of membrane anchorages 8, provided as protuberances of the membrane 2 that extend from its peripheral regions towards the same substrate.

An insulation layer 9, for example made of silicon nitride (SiN), set on the substrate 5 enables, inter alia, electrical insulation of the membrane anchorages 8 from the substrate 5. The membrane anchorages 8 also have the function of suspending the membrane 2 over the substrate 5 at a certain distance therefrom. The value of this distance is a function of a compromise between the linearity of response at low frequencies and the noise of the MEMS capacitive microphone. In order to enable release of residual (tensile and/or compressive) stresses in the membrane 2, for example deriving from the manufacturing process, through openings 10 are formed through the membrane 2, in particular in the proximity of each membrane anchorage 8; the through openings 10 enable "equalization" of the static pressure on the two faces of the membrane 2.

The back plate 3 is anchored to the substrate 5 by means of plate anchorages 11 provided in its peripheral regions; the plate anchorages 11 are, for example, constituted by pillars made of the same conductive material as the back plate 3, set on top of the substrate 5 and electrically insulated from the substrate via the insulation layer 9. The back plate 3 rests peripherally on portions set on top of one another of a first sacrificial layer 12a, a second sacrificial layer 12b, and a third sacrificial layer 12c, external to the area occupied by the membrane 2 and by the plate anchorages 11. The back plate 3 also has a plurality of, preferably circular, holes 13 having the function of favouring, during the manufacturing steps, removal of the underlying sacrificial layers and, in use, enabling free circulation of air between the back plate 3 and the membrane 2 (making indeed the back plate 3 "acoustically transparent"). In use, the holes 13 consequently have the function of acoustic access port for enabling the acoustic-pressure waves to reach and deform the membrane 2.

Alternatively, in a way not illustrated in FIG. 1, the incident acoustic-pressure waves can reach the membrane 2 through the cavity 6, which hence performs, in this case, the function of acoustic access port (so-called "front chamber").

The MEMS sensing structure 1 further comprises a membrane electrical contact 14 and a back-plate electrical contact 15, both made of conductive material, used, during operation of the MEMS microphone, for biasing the membrane 2 and the back plate 3 and collecting a capacitive-variation signal due to the deformation of the membrane 2 caused by the incident acoustic-pressure waves. As illustrated in FIG. 1, the membrane electrical contact 14 is formed in part in the same layer in which the back plate 3 is provided, from which it is electrically insulated, and is electrically connected to the membrane 2 via a conductive plug. The back-plate electrical contact 15 can be advantageously provided in the same layer in which the back plate 3 is provided, by contacting it directly, and is electrically connected to a contact pad accessible from outside.

In a known way, the sensitivity of the MEMS capacitive microphone depends upon the mechanical characteristics of the membrane 2 of the MEMS sensing structure 1 (in particular, upon its mechanical compliance), and moreover upon assembly of the membrane 2 and of the back plate 3. Furthermore, the volume of the front acoustic chamber (traversed in use by the incident acoustic-pressure waves) and back acoustic chamber (set at the reference pressure) has a direct effect on the acoustic performance. In particular, the volume of the front chamber determines in a known way the upper resonance frequency of the microphone, and hence its performance for high frequencies (the front chamber constitutes in fact a sort of Helmholtz resonator): in general, the smaller the volume of the front chamber, the higher the upper cut-off frequency of the microphone. In a known way, it is also desirable to provide a back chamber of large dimensions so as to improve the frequency response and sensitivity of the microphone.

The package of the microphone must moreover be configured so as to house not only the MEMS sensing structure 1 but also the reading electronics associated thereto, generally provided as an ASIC (Application Specific Integrated Circuit), electrically coupled to the MEMS sensing structure 1. At the design stage, it must also be considered that acoustic transducers typically operate in unfavourable working environments, for example ones subject to high levels of RF radiation (when integrated in mobile phones, or similar wireless-communication devices).

The presence of acoustic access ports, directly communicating with the external environment, designed to enable passage of the acoustic-pressure waves towards the membrane 2, leads to the further requirement of providing appropriate screens for the incident light and barriers for the particles of dust or other material, which could jeopardize proper operation of the MEMS sensing structure and of the reading electronics.

Therefore, there is a wide range of constraints imposed upon assembly of a capacitive MEMS microphone and upon the package for the resulting assembly, which render design thereof particularly problematical, in particular where very low size is required.

A solution of assembly that has been proposed (see, for example, the patent application No. WO 2007/112743) envisages providing in a single die of semiconductor material (for example, silicon) both the MEMS sensing structure and the reading electronics of the MEMS capacitive microphone. This assembly solution is, however, very complex, posing various problems of technological compatibility. In fact, it is known that the methods and techniques for manufacturing of MEMS sensing structures differ sensibly from those of integrated electronic circuits.

An alternative solution of assembly hence envisages provision of two distinct dice of semiconductor material, a first die for the MEMS sensing structure and a second die for the reading circuitry. In a solution of this type, illustrated schematically in FIG. 2 (and described, for example, in the U.S. Pat. No. 6,781,231), a first die 20, integrating the MEMS sensing structure (illustrated schematically), and a second die 21, integrating an ASIC of the reading electronics, are coupled side-by-side on a substrate 22 of a corresponding package 24. Electrical connections 25 between the first and second dice 21, 22 are made using the wire-bonding technique, whilst appropriate metal layers and vias (not illustrated in detail) are provided in the substrate 22 for routing the electrical signals outside the package 24. Moreover, a cover 26 of the package 24 is coupled to the substrate 22, enclosing within it the first and second dice 21, 22; the cover 26 can be made of metal or pre-moulded plastic with metal layers such as to prevent disturbance caused by external electromagnetic signals (by providing a sort of Faraday cage). The cover 26 also has an opening 28 to enable entry of acoustic pressure waves; advantageously, a screen (not illustrated) may be coupled to the opening 28 for screening the incident light, or else a filter (not illustrated) to prevent access within the cover 26 of particles of dust or other material. Alternatively, or in addition, a protective coating 29, for example made of resin, can be set on the second die 22 so as to function as a further protection for the reading electronics in regard to the incident light and impurities. Pads (not illustrated) are provided on the bottom side of the substrate 22 for soldering and electrical connection to an external printed circuit board.

Also this solution is not, however, free from drawbacks, amongst which the fact of entailing large dimensions for accommodating side-by-side the two dice of the acoustic transducer and for providing the corresponding package. Furthermore, this solution fails to offer the designer an ample freedom (as instead would be desirable) in dimensioning of the chambers of the acoustic transducer, for determination of its electrical characteristics.

A further solution of assembly that has been proposed (see, for example, the U.S. Pat. No. 6,088,463) envisages assembly of the two dice of the MEMS sensing structure and of the reading electronics on a third die of semiconductor material, distinct from the first two dice, in which sensing structures or electronic circuits are not present, but which performs only the function of mechanical support (a so-called "dummy" die). The dice of the reading electronics and of the MEMS sensing structure are electrically and mechanically connected to the supporting die using the bump-bonding technique. In one embodiment, the two dice of the MEMS sensing structure and of the reading electronics are coupled to opposite external faces of the supporting die, and the supporting die is hence set between them. A coating cover encapsulates the entire structure, except for an access opening provided in the supporting die; this access opening communicates with the membrane of the MEMS sensing structure through a cavity etched in the same supporting die.

A solution of this type is complex to implement in so far as it entails laborious procedures of bonding with the further supporting die and of machining of the same supporting die, and is not free from problems linked to the required dimensions, which are large both in a lateral direction and in a vertical direction. Furthermore, the dimensions of the front and back chambers of the acoustic transducer are defined in a fixed way by the dimensions of the supporting die, and consequently pose constraints on sizing of the microphone performance.

Consequently, the need is certainly felt in this field to provide a suitable assembly for an acoustic transducer, in particular a MEMS capacitive microphone, and a corresponding package, which will enable the features previously referred to of low manufacturing costs, high acoustic performance and reliability, and small dimensions (comparable, for example, to those of the so-called "micro-SMD" packages) to be achieved.

BRIEF SUMMARY

One embodiment of the present disclosure solves, either totally or in part, the problems highlighted above associated with the systems of a known type.

According to the present disclosure, there is consequently provided a MEMS-acoustic-transducer assembly, substantially as defined in claim 1.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein:

FIG. 1 is a cross section of a MEMS sensing structure of a MEMS capacitive microphone of a known type;

FIG. 2 is a schematic cross section of the assembly of a MEMS capacitive microphone of a known type, and of a corresponding package;

FIG. 3b is a schematic cross section of a variant of the assembly illustrated in FIG. 3a;

FIGS. 6b and 6c show schematic cross sections of variants of the assembly illustrated in FIG. 6a;

FIG. 7a is a schematic cross section of a third embodiment according to the present disclosure of a MEMS-capacitive-microphone assembly and of the corresponding package;

FIGS. 7b and 7c show schematic cross sections of variants of the assembly illustrated in FIG. 7a;

FIGS. 8b and 8c show schematic cross sections of variants of the assembly illustrated in FIG. 8a;

FIGS. 9b and 9c show schematic cross sections of variants of the assembly illustrated in FIG. 9a;

DETAILED DESCRIPTION

As will be clarified in what follows, one aspect of the present disclosure envisages: assembly of a MEMS capacitive microphone, by arranging one over the other, in a stacked manner, a first die integrating the MEMS sensing structure, and a second die integrating the reading electronics, appropriately coupling the two dice both mechanically and electrically in a direct way (without, that is, interposition of further substrates or supporting dice); and moreover coupling of the two dice to an appropriate package so that the package itself will contribute to determining the dimensions of the front and/or back chambers of the MEMS microphone. As will be highlighted hereinafter, these features of the assembly enable reduction of the overall dimensions of the acoustic transducer and improvement of its electrical characteristics and of characteristics of protection to external agents, as well as offering the designer numerous degrees of freedom in the sizing of the acoustic chambers of the microphone for definition of its electrical performance. One or more through holes may advantageously be provided through the same second die integrating the reading electronics, which can be coupled to the first die so as to cover and protect the MEMS sensing structure and/or operate as a first interface of the microphone towards the outside world and the acoustic access port, such as to enable the acoustic-pressure waves to reach the MEMS sensing structure.

In any case, the first die integrating the MEMS sensing structure and the second die integrating the reading electronics can be manufactured separately (with specific and dedicated manufacturing processes), and then assembled in a stacked manner.

Figure 3A:
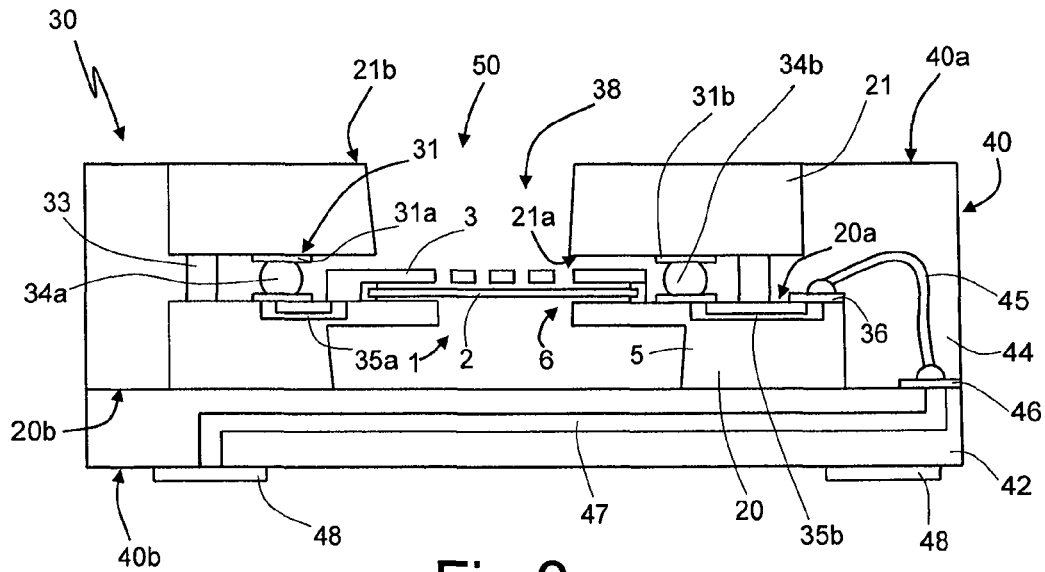
FIG. 3a is a schematic cross section of a first embodiment according to the present disclosure of an assembly of a MEMS capacitive microphone and of the corresponding package.

FIG. 3a shows a first embodiment of the present disclosure, for a MEMS-capacitive-microphone assembly, designated by 30, of the top-port type, i.e., where the access port that enables entry of the acoustic-pressure waves is provided in a position corresponding to a top surface of the MEMS capacitive microphone (opposite that is, to the surface for coupling to an external printed circuit board, which carries for this purpose appropriate electrical contacts). In FIG. 3a (and in the subsequent figures) parts that are similar to others already described previously (not described again herein) are designated by the same reference numbers.

The first die 20, integrating the MEMS sensing structure 1 (illustrated schematically herein, and made, for example, as described in detail with reference to FIG. 1), is directly coupled (without, that is, interposition of further substrates or coupling dice) to the second die 21, integrating the ASIC that provides the reading electronics, to which it is electrically and mechanically connected via the bump-bonding technique (i.e., via the use of conductive balls or bumps set between the two dice). In particular, the second die 21 is set flipped over and stacked on the first die 20 (with the so-called "flip-chip" technique) so as to have an active surface 21a, which carries appropriate electrical contact pads 31 connected to the integrated components of the reading electronics, set facing a respective active surface 20a of the first die 20 (the membrane 2 of the MEMS sensing structure 1 being provided at this active surface 20a). The active surface 20a is moreover opposite to a rear surface 20b of the first die (coinciding with the rear surface 5b of the substrate 5 defined in FIG. 1), starting from which the cavity 6 extends.

The second die 21 is heavily doped so as to obtain low values of substrate resistivity, for example of the order of 0.1 ma/cm; in this way, the second die 21 itself constitutes a shield for the electromagnetic disturbance (EMI—electromagnetic interference), when appropriately short-circuited to ground. Furthermore, advantageously, a passivation layer (not illustrated), which may, for example, be constituted by "black resist" that is opaque in regard to the infrared and the visible light, is deposited on the active surface 21a of the second die 21, so as to provide a shield for the incident light (a so-called "light shield").

To guarantee laterally hermetic closing of the acoustic cavity, a closing ring 33 is further provided, made of conductive material, in particular a metal bonding ring or alternatively a ring of solder paste defined with screen-printing technology by means of the same mask used to obtain the conductive bumps; the closing ring 33 surrounds the membrane 2 and the back plate 3 of the MEMS sensing structure 1 completely. The closing ring 33 also guarantees a good connection to ground of the second die 21, integrating the reading electronics, hence further improving the characteristics of EMI shielding, given that the electrical resistance of connection between the dice is reduced.

The closing ring 33 is advantageously made during assembly and not previously on the first die 20 or second die 21 in such a way as to enable the dice to have different dimensions; the closing ring 33 is hence obtained at the end of the process of manufacturing of the MEMS sensing structure 1 in the first die 20, and of the ASIC in the second die 21.

Furthermore, the vertical dimension (i.e., in the direction of stacking of the first and second dice 20, 21) of the conductive bumps and of the closing ring 33 is such as to define a gap sufficient to accommodate the membrane 2 and the back plate 3, and the corresponding anchorage and supporting elements (described in detail with reference to FIG. 1). In the embodiment illustrated in FIG. 3a, the first and second dice 20, 21 substantially have the same dimension in a lateral direction (transverse to the vertical stacking direction).

In detail, first conductive bumps 34a electrically connect first electrical contact pads 31a, which are set on the active surface 21a of the second die 21 (and are in turn connected at the input of the reading electronics), to first buried electrical paths 35a, provided in a surface portion of the first die 20 and electrically connected to the mobile electrode (membrane 2) and the fixed electrode (back plate 3) of the sensing capacitor of the MEMS microphone. Second conductive bumps 34b electrically connect second electrical contact pads 31b, which are also set on the active surface 21a of the second die 21 (and are connected in turn to the output of the reading electronics), to second buried electrical paths 35b, which are also provided in a surface portion of the first die 20. The second buried electrical paths 35b are connected to electrical contact pads 36 carried by the active surface 20a of the first die 20, externally with respect to the closing ring 33 (so as to be accessible from outside the same closing ring 33). The first and second buried electrical paths 35a, 35b hence advantageously enable a re-routing of the electrical signals at input to and at output from the reading electronics of the ASIC.

According to one aspect of the present disclosure, the second die 21 has, in a position vertically corresponding to the membrane 2 and the back plate 3 of the MEMS sensing structure 1, at least one through hole 38, which traverses the entire thickness thereof (in the aforesaid vertical stacking direction). The same through hole 38 constitutes in this case the acoustic access port (in what follows designated by the reference number 50) for the acoustic-pressure waves that reach the membrane 2 (and determine deformation thereof), and moreover contributes to defining the front chamber of the MEMS capacitive microphone 30; the membrane 2 and the back plate 3 are hence set facing the through hole 38. The through hole 38 may, for example, be provided by means of an appropriate dry chemical-etching step, subsequent to the steps, of a standard type, for manufacturing of the CMOS components of the reading electronics of the ASIC.

The MEMS capacitive microphone 30 further comprises a package 40, which in FIG. 3a is of the so-called "full-moulded" HLGA (Holed Land Grid Array) type (it is in any case evident that, in a substantially equivalent way, there could be provided a package of the BGA—Ball Grid Array—type). In detail, the package 40 comprises a base substrate 42, which extends in a direction transverse with respect to the aforesaid vertical stacking direction, and on which the first die 20 is fixed by means of an adhesion layer; the base substrate 42 is, for example, a multilayer organic substrate, defines the base of the package 40, and has a lateral dimension (transverse to the vertical stacking direction) greater than that of the assembly constituted by the first and second dice 20, 21, with outer portions not covered by the same assembly.

The package 40 further comprises a coating 44, for example a resin coating made via molding techniques, which surrounds the assembly constituted by the first and second dice 20, 21 and coats on top the outer portions of the base substrate 42, without, however, coating the outer surface 21b of the second die 21, which hence constitutes part of a first outer face 40a of the package 40; in this way, the through hole 38 remains free and exposed to access from outside the package 40 (constituting, as highlighted above, the acoustic access port 50 thereof).

Furthermore, electrical wire connections 45 (provided using the wire-bonding technique) connect the electrical contact pads 36 to further electrical contact pads 46, carried by the aforesaid outer portions of the base substrate 42, and through electrical connections 47, provided through the base substrate 42, connect the further electrical-connection pads 46 to external contact pads 48, made of metal material, carried by an outer surface of the base substrate 42, defining a second outer face 40b of the package 40. The contact pads 48 constitute the electrical input/output interface towards the outside of the package 40. In a per-se known manner, in the case of BGA packages, conductive bumps may instead be provided for the same purpose, for example metal balls (not illustrated), set in electrical contact with the through electrical connections 47.

In this first embodiment, the front chamber of the MEMS capacitive microphone 30 is hence defined by the through hole 38 provided through the second die 21 and by the gap between the first and second dice 20, 21 defined by the thickness of the first conductive bumps 34a and of the closing ring 33. The back chamber of the MEMS capacitive microphone 30 is instead constituted by the cavity 6 etched in the substrate 5 of the first die 20 and delimited by the base substrate 42 of the package 40.

Advantageously, the same second die 21 defines a cover for the MEMS sensing structure 1 of the MEMS capacitive microphone 30, and additional layers or structures are not required for this purpose. Furthermore, the second die 21 constitutes a first interface towards the outside world (in regard to the incident acoustic-pressure waves) for the same sensing structure, thus performing a function of mechanical protection.

Figure 3B:
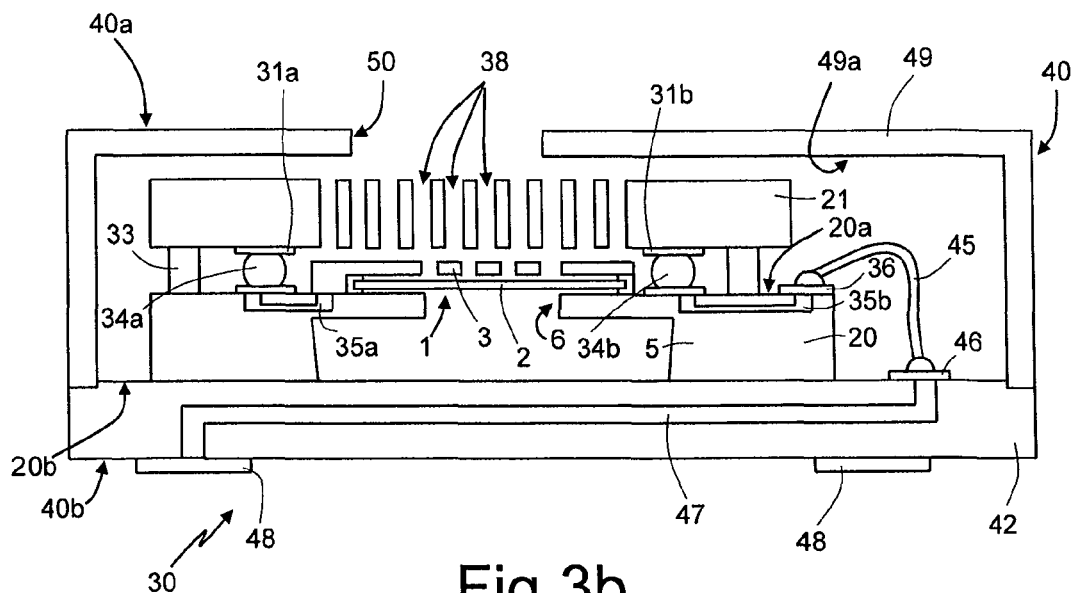

In a variant embodiment, as illustrated in FIG. 3b, a plurality of through holes 38 are provided through the second die 21, again arranged vertically in a position corresponding to the membrane 2 and the back plate 3 of the MEMS sensing structure 1. In this way, the through holes 38, if appropriately sized, in addition to enabling passage of the acoustic-pressure waves, form a mechanical filter for particles of dust and other materials coming from the external environment, preventing their entry into the acoustic chamber of the MEMS capacitive microphone 30.

Figure 4:
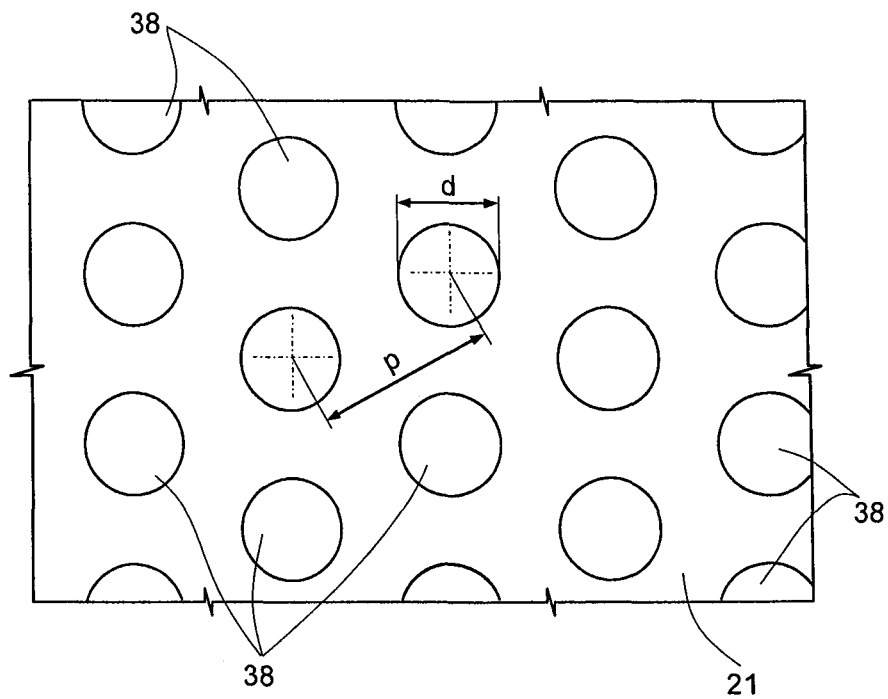
FIG. 4 is a schematic top plan view of a portion provided with through holes of a die integrating an ASIC in the assembly of FIG. 3b.

As illustrated in the top plan view of FIG. 4, the through holes 38 may, for example, have a circular cross section and be arranged according to a honeycomb lattice, in a plurality of hexagonal cells, in which the through holes 38 are set at the vertices and also at the centre of regular hexagons set side by side. For example, the diameter d of each through hole 38 can be comprised between 20 μm and 200 μm, and the pitch p between the various through holes 38 (understood as the distance between the centres of two adjacent through holes) can be comprised between 30 μm and 300 μm.

Clearly, different grid arrangements of the through holes 38 can be provided through the second die 21, for example having a chequered pattern, and the same through holes 38 can have a different section in the plane parallel to the membrane 2 (for example, a substantially square section).

Figure 5:
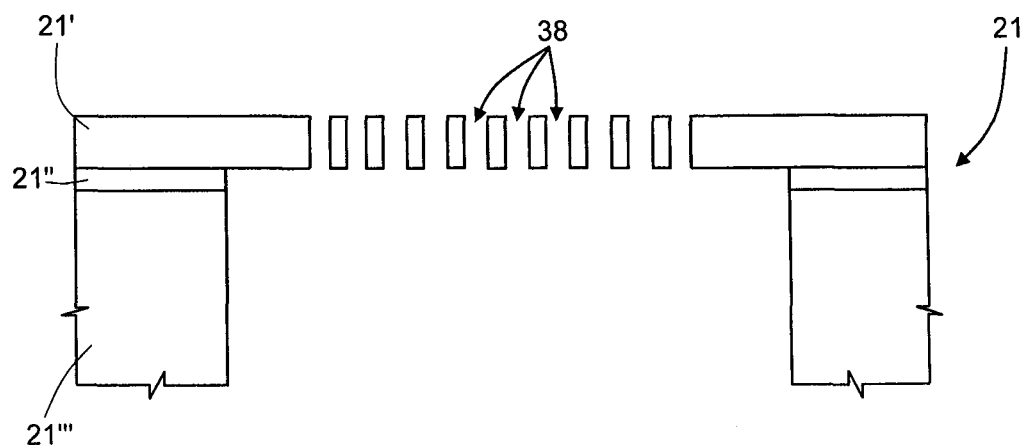
FIG. 5 is a schematic cross section of the portion of the die of FIG. 4.

Advantageously, as illustrated in FIG. 5, in the case where the second die 21 is obtained with SOI (Silicon On Insulator) technology, the through holes 38 can be made through an active layer 21' of semiconductor material (in particular, in a corresponding central portion of the active layer), which moreover houses the CMOS components of the electronic circuitry (in particular, in a peripheral portion). Underneath the aforesaid central portion a single cavity may, instead, be provided through an intermediate layer 21", made of silicon oxide, and a base layer 21' (which is also made of semiconductor material) of the SOI wafer. In this case, the depth of the through holes 38 (in the vertical stacking direction) can be advantageously reduced, and the intermediate layer 21" can be used as stopping layer for providing an automatic etch stop in the formation of the through holes 38.

In the variant embodiment of FIG. 3b, the package 40 is of the pre-moulded type; it is in any case evident that, also in the case of a full-moulded HLGA (or BGA) package of the type illustrated in FIG. 3a, there can be envisaged the provision of the plurality of through holes 38, having the function of mechanical filter.

The package 40 comprises in this case a cover casing 49, made of plastic material, metal material, or plastic material with metalized surfaces (these two latter options being advantageous for shielding the electromagnetic disturbance), coupled on the base substrate 42 so as to define an internal space 49a, such as to accommodate the assembly constituted by the first and second dice 20, 21. The cover casing 49 moreover has an acoustic access port 50 to enable entry of the acoustic-pressure waves into the internal space 49a. The acoustic access port 50 can be set in a position corresponding to the through holes 38 provided through the second die 21; alternatively, the acoustic access port 50 can be set laterally at a distance from the through holes 38, in such a way as to further protect the microelectromechanical structure of the MEMS capacitive microphone 30 from dust and particles coming from outside (in any case, the through holes 38 are in fluid communication with the acoustic access port 50).

In this embodiment, the package 40 has the advantage of causing lower mechanical stresses on the MEMS sensing structure 1 as compared to the HLGA implementation illustrated in FIG. 3a; however, with the same dimensions of the first and second dice 20, 21, the package 40 proves to have a larger thickness (in a vertical direction) and a greater width (in a lateral direction).

Figure 6A:
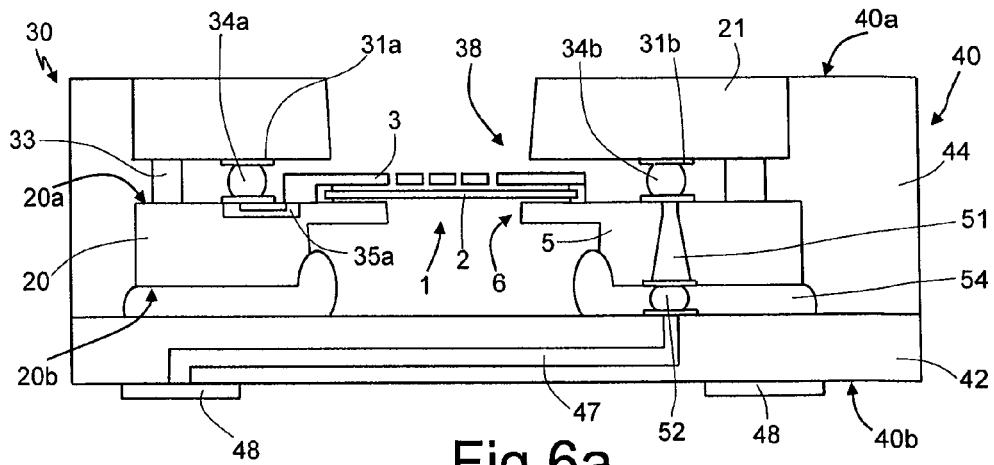
FIG. 6a is a schematic cross section of a second embodiment according to the present disclosure of a MEMS-capacitive-microphone assembly and of the corresponding package.
Figure 6B:
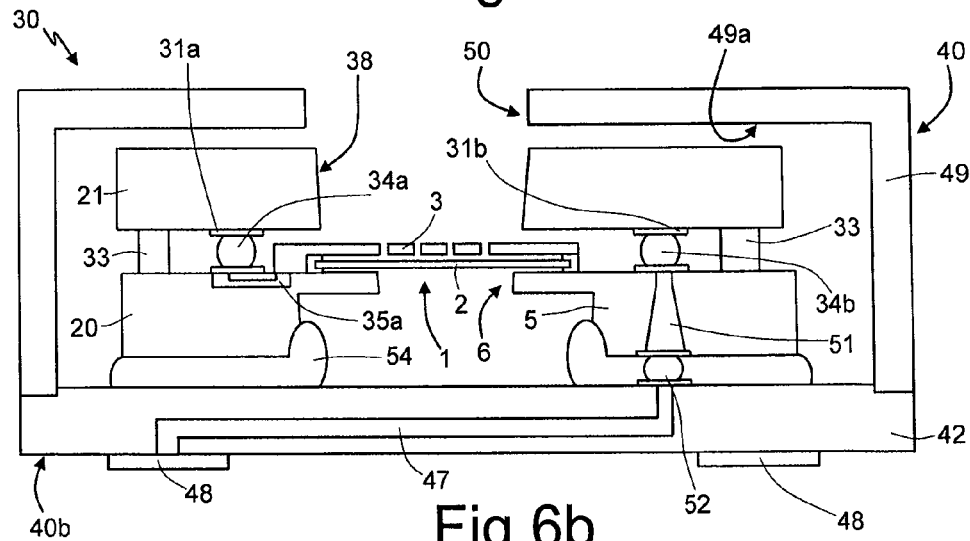
Figure 6C:
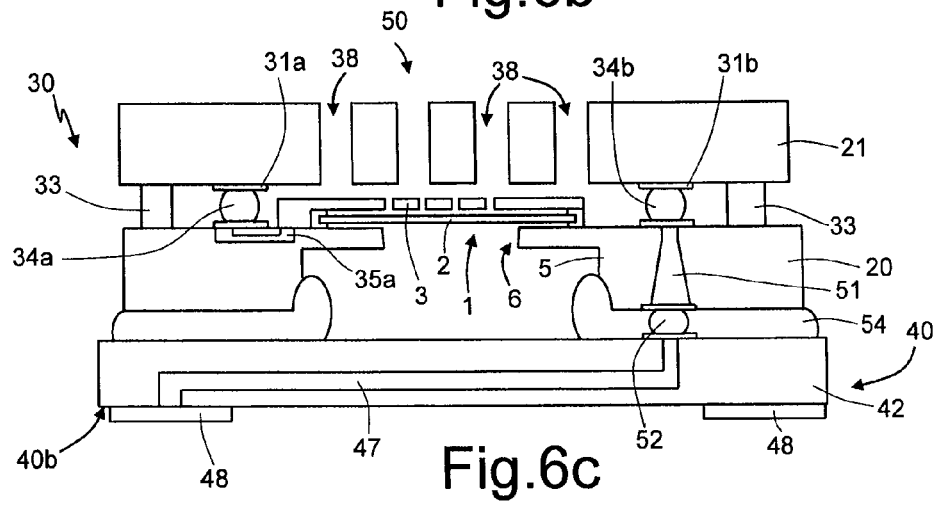

FIGS. 6a-6c show variants of a second embodiment of the MEMS-capacitive-microphone assembly 30 and of the corresponding package 40, once again of the top-port type (it is emphasized that, also for this embodiment and for the subsequent ones that will be described, it may be conceived to provide, alternatively, a single through hole 38 or a plurality of through holes 38 through the entire thickness of the second die 21, even though this is not explicitly illustrated).

This second embodiment envisages further reduction of the dimensions of the package 40 and further improvement of the EMI-shielding performance, eliminating the interconnections via wire bonding between the assembly constituted by the first and second dice 20, 21 and the base substrate 42, and using, instead, for this purpose so-called "through silicon vias" 51, provided (in a per-se known manner) through the entire thickness of the first die 20.

In particular, the through vias 51 connect in this case the second conductive bumps 34b to third conductive bumps 52 (obtained with the bump-bonding technique), which electrically connect the first die 20 to the base substrate 42, and in particular to the through electrical connections 47 provided through the same base substrate 42. As illustrated in FIGS. 6a-6c, in contact with and in points corresponding to the third conductive bumps 52, further contact pads may be present on the mutual facing surfaces of the first die 20 and of the base substrate 42. The third conductive bumps 52 are hence set between the through vias 51 and the through electrical connections 47 that traverse the base substrate 42.

In this case, for hermetic closing of the acoustic cavity at the interface between the first die 20 and the base substrate 42, a filling layer 54 (the so-called "under-filling") is formed. The filling layer 54 has a controlled viscosity in such a way as to prevent its contact with the sensing sensitive structures (in particular, with the membrane 2 and the back plate 3 of the MEMS sensing structure 1 of the MEMS capacitive microphone 30).

This assembly solution can be applied to packages 40 of an HLGA type (as illustrated in FIG. 6a) or to packages 40 of the pre-moulded type (as illustrated in FIG. 6b).

Furthermore, as illustrated in FIG. 6c, the presence of the through vias 51, of the filling layer 54, and of the grid of through holes 38 provided through the second die 21 enables complete elimination of the top part of the package 40 (the cover casing 49), leaving just the base substrate 42. In this case we refer to a "substrate-package" solution or "substrate-level-package" solution. A further reduction of the total dimensions is thus possible, in an evident manner.

In this second embodiment, the back chamber of the MEMS capacitive microphone 30 is constituted by the cavity 6 etched in the first die 20 and delimited by the base substrate 42 (in addition to the filling layer 54), whilst the front chamber is defined again by the gap present between the first and second dice 20, 21 in the vertical direction of mutual stacking, by the through holes 38, and possibly by the internal space 49a of the cover casing 49 (where present).

FIGS. 7a-7b show variants of a third embodiment, corresponding to a MEMS capacitive microphone 30 of the bottom-port type, where, that is, the access port that enables entry of the acoustic-pressure waves is provided at a bottom surface of the MEMS capacitive microphone (in particular, the second outer face 40b, corresponding to the surface for coupling of the package 40 to an external printed circuit board). The acoustic access port 50 is in this case constituted by a through opening that traverses the base substrate 42 for an entire thickness thereof.

The first die 20 is stacked upside down (using the flip-chip technique) on the second die 21, with the necessary electrical and mechanical connections made using the bump-bonding technique. Once again, there are consequently present the first conductive bumps 34a, which electrically connect the first electrical contact pads 31a to the first buried electrical paths 35a. Also here the closing ring 33 is provided, made of metal material or solder paste, which surrounds the membrane 2 and the back plate 3 of the MEMS sensing structure 1 completely and guarantees lateral closing of the acoustic cavity, as well as connection to ground of the second die 21 and EMI shielding. The electrical contact pads 36 (connected to the output of the reading electronics) are in this case carried directly by the active surface 21a of the second die 21, externally with respect to the closing ring 33, and once again electrically connected to the through electrical connections 47 of the base substrate via the electrical contact pads 46 and the electrical wire connections 45.

Also in this third embodiment, the second die 21 constitutes the first interface of the MEMS capacitive microphone 30 in regard to the external environment and to the incident acoustic-pressure waves (it being set in the proximity of, and facing, the acoustic access port 50). In particular, the through holes 38 (which once again form a mechanical filter in regard to the possible impurities coming from the external environment) are set in fluid communication with the acoustic access port 50. The second die 21 moreover constitutes once again a mechanical cover for the first die 20 and in particular for the MEMS sensing structure 1 (comprising the membrane 2 and the back plate 3).

The package 40 is in this case of a pre-moulded-metal or pre-moulded-plastic type, and has a cover casing 49 without further openings towards the outside world. The internal space 49a defined by the cover casing 49 hence defines the back chamber of the MEMS capacitive microphone 30, the front chamber of which is instead defined by the gap present between the first and second dice 20, 21 (as well as by the through holes 38 and the acoustic access port 50).

A variant of the third embodiment, illustrated in FIG. 7b, differs from the one described previously on account of the absence of electrical wire connections. In this case, to provide the electrical connection between the electronics integrated in the second die 21 and the base substrate 42 of the package 40, through vias 51 are provided through the second die 21 itself, which is moreover connected to the base substrate 42 with the bump-bonding technique, via the third conductive bumps 52. In particular, the through vias 51 are set between the third conductive bumps 52 and the electrical contact pads 36, which are in this case carried by the active surface 21a of the second die 21 internally with respect to the closing ring 33. Also in this case, between the second die 21 and the base substrate 42 the under-filling 54 with controlled viscosity is present.

A further variant, illustrated in FIG. 7c, envisages the possibility, using the through vias 51 (substantially with the same structure described with reference to FIG. 7b), of providing a substrate-level package 40 (i.e., one which has just the base substrate 42 without any cover casing). This variant can prove particularly advantageous in so far as it enables creation of a back chamber of ideally infinite volume (in so far as it is virtually constituted by the external environment that surrounds the MEMS capacitive microphone 30), with a considerable improvement in the sensitivity of the sensor. Once again, there are in this case provided the plurality of through holes 38 through the second die 21, acting as filter for the impurities coming from the external environment.

Figure 8A:
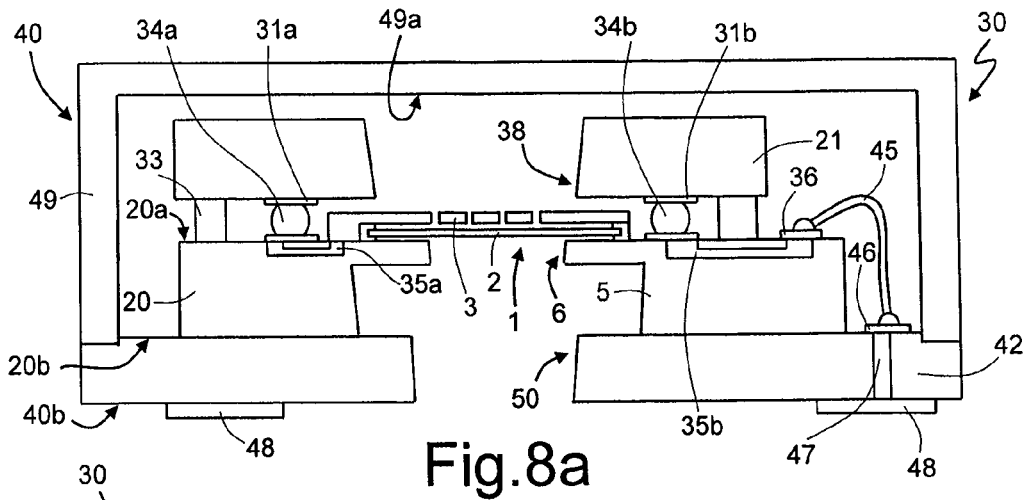
FIG. 8a is a schematic cross section of a fourth embodiment according to the present disclosure of a MEMS-capacitive-microphone assembly and of the corresponding package.

FIG. 8a shows, instead, a first variant of a fourth embodiment of the present disclosure, which does not differ substantially from what is illustrated in FIG. 3b, apart from the fact of presenting a configuration of the bottom-port type and hence an acoustic access port 50 that traverses the base substrate 42.

Consequently, also in this case the second die 21 is stacked upside down (using the flip-chip technique) on the first die 20, to which it is connected with the bump-bonding technique. Again, the closing ring 33 and the first and second buried electrical paths 35a, 35b are provided for re-routing the electrical signals.

The front cavity is defined here by the cavity 6 etched in the substrate 5 of the first die 20, whilst the rear cavity is formed by the gap between the first and second dice 20, 21, by the through hole 38 provided in the second die 21, and by the internal space 49a defined by the cover casing 49 of the package 40.

In this fourth embodiment, it is clearly not possible to exploit the possible grid of through holes 38 that may be made through the second die 21, for filtering the impurities coming from the external environment in which the MEMS capacitive microphone 30 is to operate (in this case, the second die 21 is not in fact set in a position corresponding to, and facing, the acoustic access port 50).

Figure 8B:
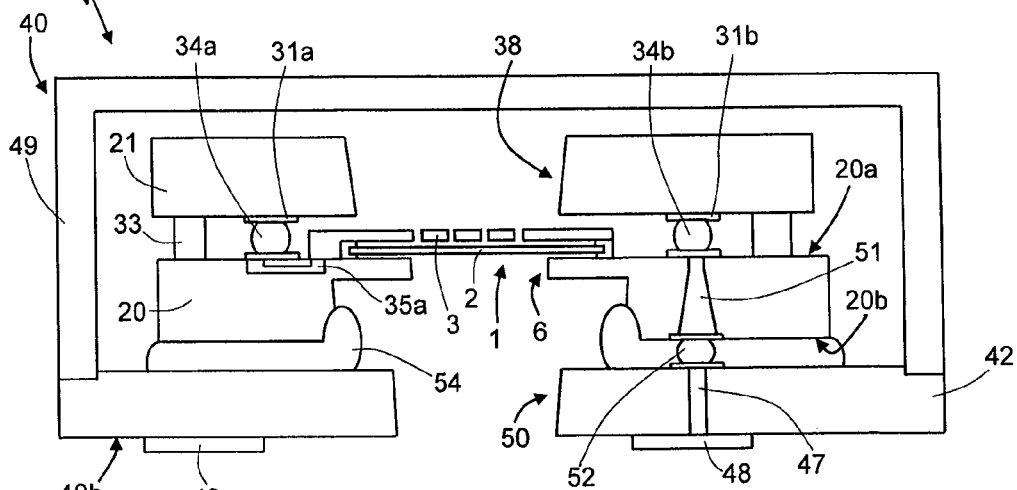

A second variant of the fourth embodiment (FIG. 8b), envisages instead: use of the through vias 51 for the electrical connection between the first die 20 and the base substrate 42; connection via the bump-bonding technique between the first die 20 itself and the base substrate 42; use of the controlled-viscosity filling layer 54; and use of a package 40 of a pre-moulded type (in this case without openings, given the presence of the acoustic access port 50 through the base substrate 42).

Figure 8C:
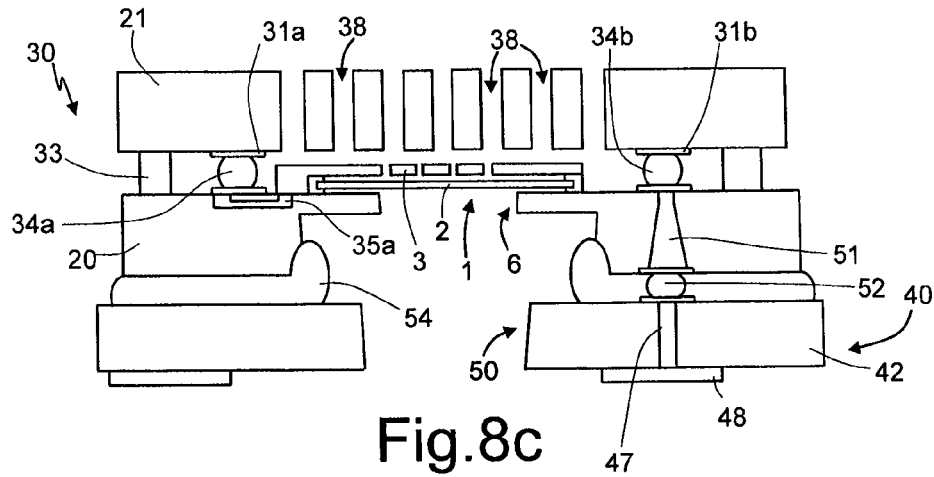

A third variant, illustrated in FIG. 8c, envisages the possibility, using the through vias 51, of providing once again a substrate-level package 40 (with just the base substrate 42 without any cover casing). Advantageously, a back chamber is created of ideally infinite volume (in so far as it is virtually constituted by the external environment that surrounds the MEMS capacitive microphone 30), with a considerable improvement of the sensitivity of the sensor. The plurality of through holes 38 through the second die 21 also constitutes here a filter for the impurities coming from the external environment. As in the previous variants, the front chamber of the MEMS capacitive microphone 30 is defined here by the cavity 6, etched in the first die 20 and delimited by the base substrate 42 of the package 40 (as well as the filling layer 54).

A fifth embodiment of the present disclosure envisages a solution of the top-port type, where the acoustic access port 50 is again provided through the cover casing 49 of a package 40 of a pre-moulded (metal or plastic) type. In this case, the second die 21 is mounted stacked underneath the first die 20, in contact with the substrate 5, delimiting at the bottom the cavity 6 etched in the first die 20. In other words, the second die 21 is here set in contact with the rear surface 20b of the first die 20.

Figure 9A:
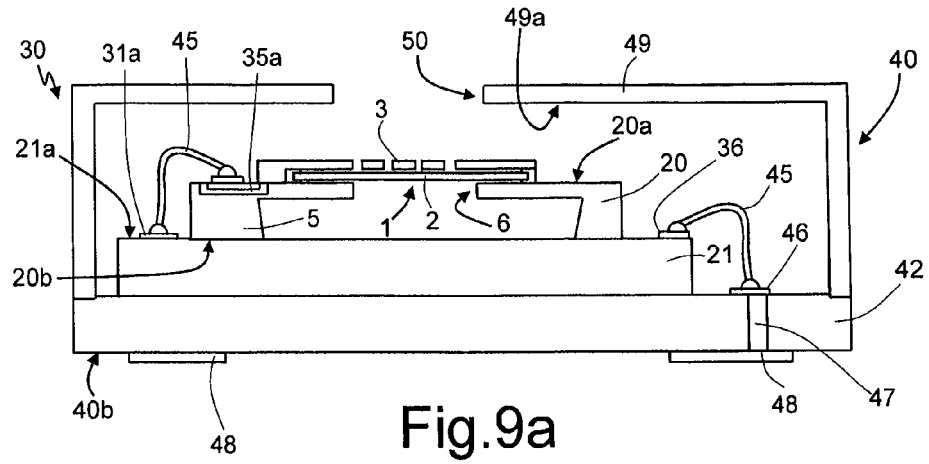
FIG. 9a is a schematic cross section of a fifth embodiment according to the present disclosure of a MEMS-capacitive-microphone assembly and of the corresponding package.

In a first variant (illustrated in FIG. 9a) electrical wire connections 45 are provided, both for connection between the first and second dice 20, 21 and for connection between the second die 21 and the base substrate 42. In particular, first electrical wire connections 45 connect the first buried electrical paths 35a in the first die 20 to the first electrical contact pads 31a carried by the active surface 21a of the second die 21, whilst second electrical wire connections 45 connect the electrical contact pads 36, which are also carried by the active surface 21a of the second die 21, to the through electrical connections 47 in the base substrate 42 (via the electrical contact pads 46). The first and second dice 20, 21 are here mechanically coupled via interposition of a conductive or non-conductive adhesive material (the so-called "die attach"). The adhesive material has an appropriate softness (having a Young's modulus comprised between 0.1 MPa and 10 MPa) in such a way as to uncouple mechanically the MEMS sensing structure 1 from the package 40 and from the stresses induced thereby.

In this first variant, the back chamber of the MEMS capacitive microphone 30 is constituted by the cavity 6, here delimited by the active surface 21a of the second die 21, whilst the front chamber is defined by just the internal space 49a defined by the cover casing 49 of the package 40. Also in this case, it is not possible to exploit the through holes 38 possibly provided through the second die 21 for filtering the impurities coming from the external environment, in so far as said second die 21 is not set in a position corresponding to the acoustic access port 50.

Figure 9B:
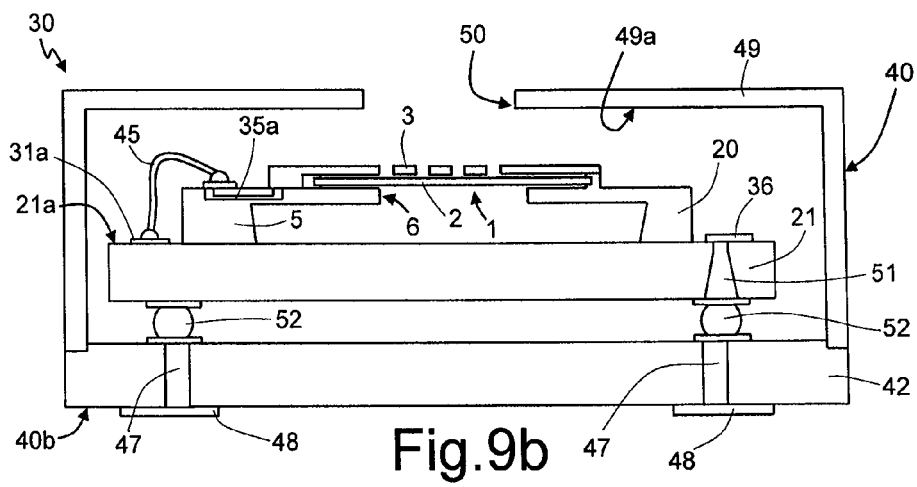

In a second variant of the aforesaid fifth embodiment (illustrated in FIG. 9b) through vias 51 are provided through the second die 21, which is moreover connected to the base substrate 42 by means of the bump-bonding technique (with the presence of the third conductive bumps 52 set between the through electrical connections 47 and the electrical contact pads 36). Electrical wire connections 45 are again present for electrical connection between the first and second dice 20, 21 (in a way substantially similar to what has been discussed previously).

Figure 9C:
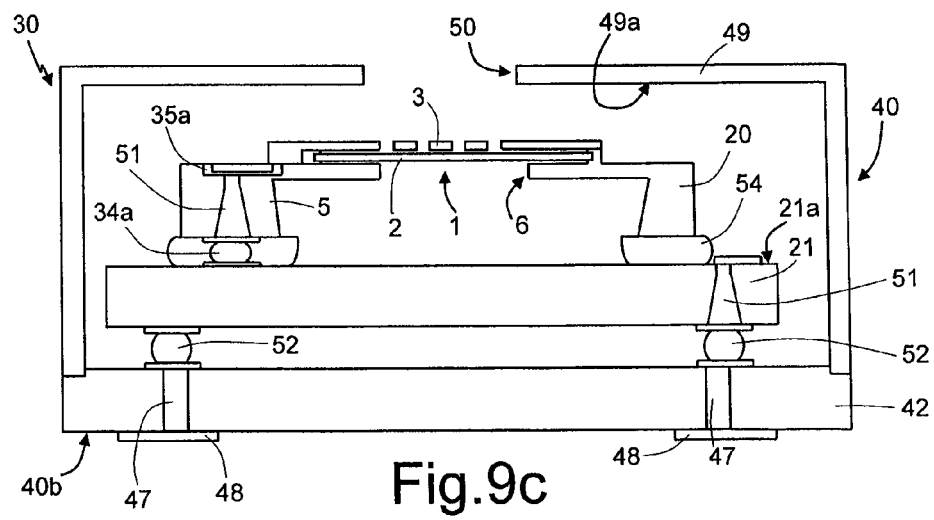

In a third variant, illustrated in FIG. 9c, further through vias 51 are provided through the first die 20, for electrical connection of the first buried electrical paths 35a in the surface portion of the first die 20 to the first electrical contact pads 31a carried by the second die 21. In this case, also the first and second dice 20, 21 are connected together with the bump-bonding technique by means of the first conductive bumps 34a; in addition, there is again provided the controlled-viscosity filling layer 54, for laterally closing the cavity 6 of the first die 20.

Both in the second variant embodiment and in the third variant embodiment, the second die 21 can also be advantageously turned upside down (with the flip-chip technique) so that the active surface 21a, in a position corresponding to which the electronic components are provided, will come to be protected from the light that enters through the acoustic access port 50 of the cover casing 49 of the package 40. The screening performance to light of the electronics of the MEMS capacitive microphone 30 can thus be improved.

In this fifth embodiment, the provision of through holes 38 through the second die 21 is not strictly required; alternatively, it is in any case possible to make one or more through holes 38 in order to increase the volume of the back chamber and consequently the sensitivity of the sensor (in fact, in this case the back cavity also includes the gap between the second die 21 and the base substrate 42 of the package 40).

Figure 10:
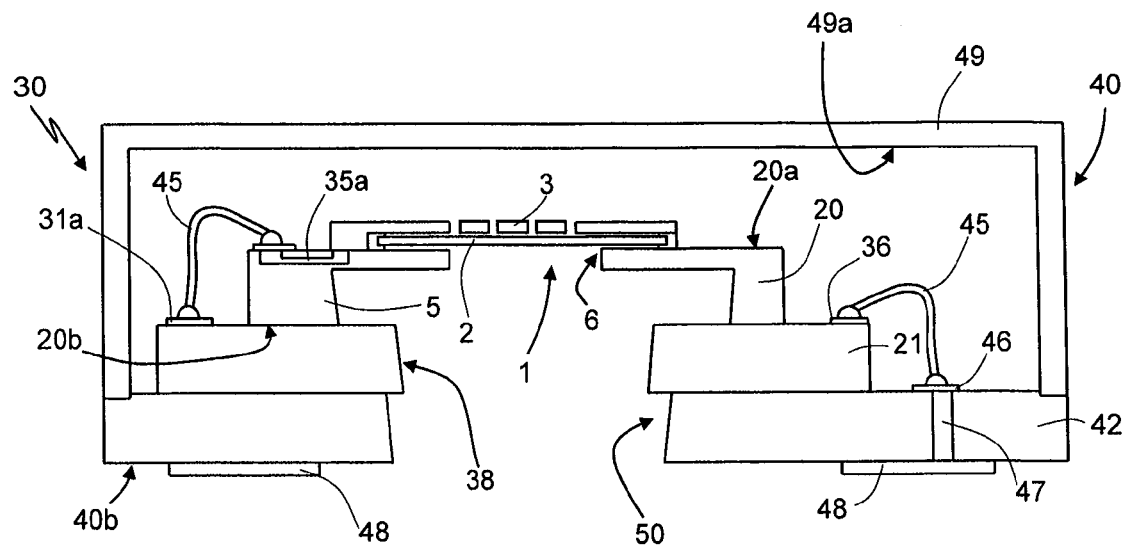
FIG. 10 is a schematic cross section of a sixth embodiment according to the present disclosure of a MEMS-capacitive-microphone assembly and of the corresponding package.

Finally, a sixth embodiment of the present disclosure (illustrated in FIG. 10) envisages the possibility of providing an assembly constituted by the first and the second die 20, 21 substantially similar to that of the aforesaid fifth embodiment, in a package of the bottom-port type, where the acoustic access port 50 is provided through the base substrate 42 of the package 40. In particular, electrical wire connections 45 are here provided for the electrical connection between the first die 20, the second die 21, and the base substrate 42 (the various elements being connected mechanically, for example, via appropriate adhesive layers, with characteristics such as to uncouple the MEMS sensing structure 1 from the stresses induced by the package 40).

In this sixth embodiment, one or more through holes 38 are again made through the second die 21 (for simplicity, in FIG. 10 only one of them is illustrated) in such a way as to be in fluid communication both with the acoustic access port 50 and with the cavity 6 provided in the first die 20. The front chamber of the MEMS capacitive microphone 30 is hence defined by the set of the aforesaid cavity 6 and through holes 38, whilst the back chamber is defined exclusively by the internal space 49b of the cover casing 49 of the package 40.

The advantages that the described assembly and the corresponding package allow to achieve emerge clearly from the foregoing discussion.

In particular, the solution that envisages stacking the dice of the MEMS sensing structure and of the ASIC of the reading electronics enables a considerable reduction in the overall dimensions of the microphone, and does not present the disadvantages linked to the provision of the MEMS structure and of the electronic circuitry in one and the same die or to the use of further silicon substrates that function as simple mechanical support.

It is moreover possible, especially in the case of top-port embodiments, to obtain a considerable reduction of the free space within the package (front chamber of the microphone), upon which the acoustic resonance frequency depends, consequently obtaining a greater bandwidth and, in general, improved electrical performance.

In any case, the use of the package as active element contributing to define the volume of the front and/or back chambers of the MEMS capacitive microphone offers the designer a further degree of freedom for defining the performance of the sensor.

Moreover advantageous is the possibility of setting the die that integrates the ASIC directly on top of the die that integrates the MEMS sensing structure so as to cover the membrane of the microphone, without any need to use for this purpose further layers or structures of mechanical cover. In particular, the provision of the through holes through the die that integrates the ASIC, with appropriate dimensions and arrangement, enables a mechanical filter to be obtained for protecting the MEMS sensing structure from the particles and dust introduced from outside through the acoustic access port. Clearly advantageous for this purpose is the arrangement of the die integrating the ASIC as first interface for the acoustic-pressure waves, in the proximity of, and facing, the acoustic access port of the package (with the aforesaid through holes in direct fluid communication with the acoustic access port). In this case, it is also possible to achieve a considerable improvement in the characteristics of screening to light and shielding to EMI, by providing appropriate doping and/or passivation materials for the die integrating the ASIC.

Advantageously, the provision of the through holes does not involve introduction of additional complex process steps, given that they can be envisaged as last step of the process, by means of a dry through etching.

Figure 11:
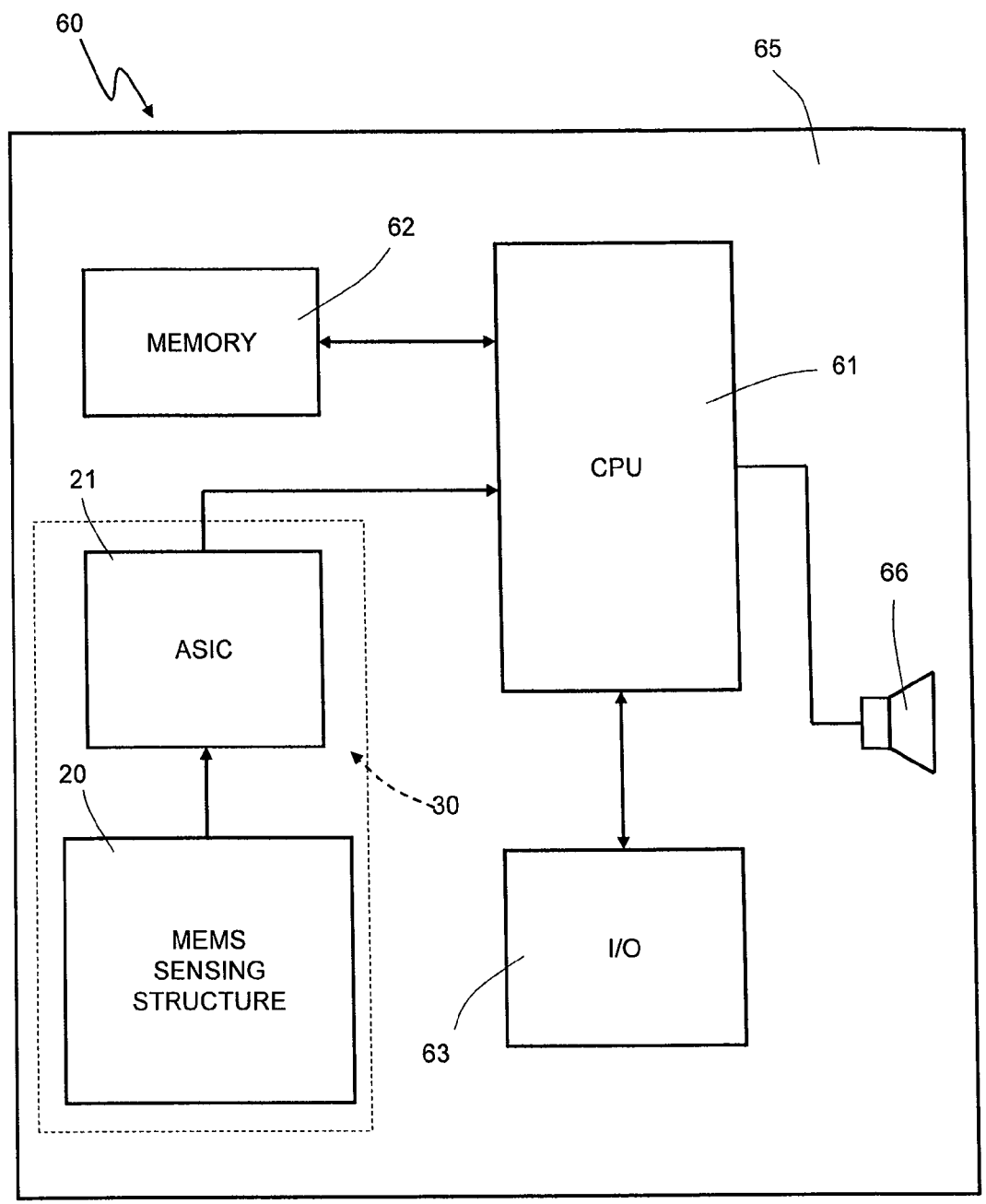
FIG. 11 shows a simplified block diagram of an electronic device provided with a MEMS-capacitive-microphone assembly according to the present disclosure.

The characteristics previously described render the use of the MEMS capacitive microphone 30 particularly advantageous in an electronic device 60, as illustrated in FIG. 11 (the electronic device 60 may possibly comprise further MEMS microphones 30, in a way not illustrated). The electronic device 60 is preferably a mobile communication device, such as for example a mobile phone, a PDA, a notebook, but also a voice recorder, a reader of audio files with voice-recording capacity, etc. Alternatively, the electronic device 60 can be a hydrophone, capable of operating under water, or else a hearing-aid device.

The electronic device 60 comprises a microprocessor 61, a memory block 62, connected to the microprocessor 61, and an input/output interface 63, for example provided with a keyboard and a display, which is also connected to the microprocessor 61. The MEMS capacitive microphone 30 communicates with the microprocessor 61; in particular, the ASIC integrated in the second die 21 sends the electrical output signals to the microprocessor 51 (a further electronic circuit for processing these electrical output signals may possibly be present). Furthermore, a loudspeaker 66 is provided for generation of sounds on an audio output (not illustrated) of the electronic device 60.

As illustrated schematically, the MEMS capacitive microphone 30, the microprocessor 61, the memory block 62, the input/output interface 63, and the possible further electronic components are mounted on a single printed circuit 65 (PCB—Printed Circuit Board), for example with the SMD technique.

Finally, it is clear that modifications and variations may be made to what has been described and illustrated herein, without thereby departing from the scope of the present disclosure, as defined in the appended claims.

Figure 12:
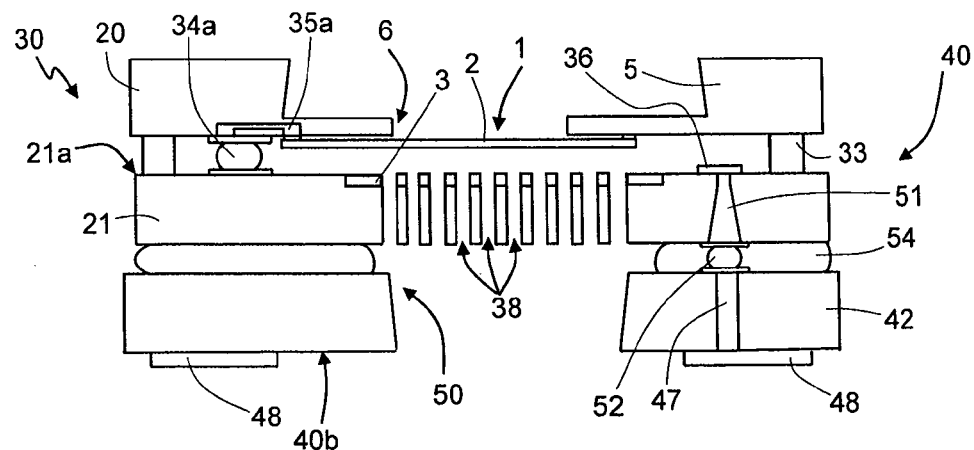
FIG. 12 shows a schematic cross section of yet a further variant of a MEMS-capacitive-microphone assembly and of the corresponding package.

In particular, according to a further variant embodiment, illustrated in FIG. 12 (which merely by way of example illustrates a structure similar to the one illustrated in FIG. 7c), the back plate 3 of the MEMS capacitive microphone is provided directly on the second die 21 integrating the ASIC of the reading electronics, in a position corresponding to the active surface 21a; in particular, exploited for this purpose is the last metal level available (in a per-se known manner)

according to the process used for manufacturing the ASIC. In this case, the through holes 38 are clearly made also through this metal level. This variant has the advantage of enabling a more convenient control of the residual stresses of the membrane 2, in so far as it does not envisage the provision of further structures on the first die 20 integrating the MEMS sensing structure (with an improvement in the thermal budget of the manufacturing process). Clearly, this variant can be applied to all the embodiments described previously, which envisage a facing between the membrane 2 and the active surface 21a of the second die 21, and hence the flip-chip arrangement of the second die 21 itself or, alternatively, of the first die 20 (the two dice being in any case set on top of one another).

Different arrangements of the through holes provided through the die integrating the ASIC could moreover be envisaged (or a different geometrical shape or size of the same holes), which in any case will enable provision of a mechanical filter for the particles and dust coming from the external environment.

Furthermore, it is evident that the described assembly and packaging solutions could be equally applied to further types of transducers that require the presence of two dice (one integrating a sensing structure and the other a reading electronics) within one and the same package, which is provided with an access port towards the outside world; for example, this solution could be used in different types of acoustic transducers, in microelectromechanical pressure sensors, sensors for detecting gas, or ultrasound sensors.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A microelectromechanical acoustic transducer assembly, comprising:
   a microelectromechanical system (MEMS) sensing structure including a sensing capacitor that includes:
      a rigid electrode; and
      a membrane integrated in a first die of semiconductor material, the membrane having a first surface in fluid communication with a front chamber and a second surface, opposite to the first surface, in fluid communication with a back chamber, said membrane being configured to undergo deformation as a function of incident acoustic-pressure waves from said front chamber, and facing the rigid electrode, the sensing capacitor having capacitance that varies as a function of the deformation of said membrane;
   an electronic circuit integrated in a second die of semiconductor material, operatively coupled to said MEMS sensing structure, and configured to supply an electrical output signal as a function of the capacitive variation of said sensing capacitor; and
   a package configured to house said first die and said second die and including a base substrate carrying electrical contacts for connection of said microelectromechanical acoustic transducer assembly externally, wherein:
      said first die and said second die are stacked on one another in said package and are directly connected together mechanically and electrically,
      said package directly delimits a first side at least one of said front chamber and said back chamber and the membrane delimits a second side of the at least one of said front chamber and said back chamber,
      said first die includes a substrate having an active surface at which said membrane is arranged, and a rear surface starting from which the back chamber extends, through said substrate to said membrane; and
      said second die is stacked on said first die and has a facing surface facing said active surface of said first die so as to be arranged over said membrane.

2. The assembly according to claim 1, wherein said second die is stacked on said first die in such a way as to define an empty space in a position corresponding to said membrane so as to enable the membrane to be deformed.

3. The assembly according to claim 2, further comprising:
   bumps of conductive material configured to mechanically and electrically couple the first die with the second die and contribute to define said empty space above said membrane; and
   a closing ring of conductive material set between said first die and said second die and surrounding said membrane, the closing ring being configured to hermetically close said empty space.

4. The assembly according to claim 1, wherein said rigid electrode is formed by a conductive layer carried by said second die, set adjacent to said facing surface of said second die.

5. The assembly according to claim 1, wherein said second die has a through hole configured to enable entry of said acoustic pressure waves, and in fluid communication with said membrane.

6. The assembly according to claim 5, wherein said package has an access port configured to enable entry of said acoustic pressure waves, and wherein said through hole is one of a plurality of through holes of said second die, the plurality of through holes being in fluid communication with said access port and said membrane, and being arranged in such a way as to define a mechanical filter with respect to impurities entering the assembly through the access port.

7. The assembly according to claim 6, wherein said through holes are arranged to form a honeycomb or checkerboard lattice and have a circular or square cross section in a plane extending parallel to a longitudinal plane of said membrane.

8. The assembly according to claim 7, wherein said through holes have in said cross section a diametric or lateral dimension between 20 μm and 200 μm, and are arranged, in said lattice, at a pitch between 30 μm and 300 μm from one another.

9. The assembly according to claim 5, wherein said second die comprises a silicon-on-insulator (SOI) wafer, and said through hole is provided through an active layer of said SOI wafer; said second die having, in a position corresponding to said through hole, a cavity provided through an intermediate insulating layer and a base layer of said SOI wafer.

10. The assembly according to claim 5, wherein said package is a substrate-level package and comprises a coating set on said base substrate and laterally surrounding said first die and said second die; and wherein said through hole defines an external access port.

11. The assembly according to claim 5, wherein said second die has doping and resistivity characteristics such as to be operable as a shield for an external electromagnetic disturbance; the assembly further comprising a passivation material set on said facing surface of said second die and configured to provide a screen for incident light.

12. The assembly according to claim 5, wherein said second die has doping and resistivity characteristics such that the second die is configured to shield against an external electromagnetic disturbance.

13. The assembly according to claim 1, further comprising electrical connectors electrically connecting at least one of said first and second dies to said base substrate, the electrical connectors including electrical wire connections, and through vias provided through said first die and/or said second die.

14. The assembly according to claim 13, wherein said base substrate includes an outer surface, opposite to a surface for coupling with said first die and said second die, the assembly further comprising:
 electrical contact pads positioned on the outer surface of the base substrate and configured to connect to an external electrical circuit board, and
 through electrical connections extending through the base substrate and configured to enable electrical connection of said first die and/or said second die to said electrical contact pads.

15. The assembly according to claim 1, wherein said base substrate delimits and defines said at least one of said front chamber and said back chamber.

16. The assembly according to claim 1, wherein said package has a casing coupled to said base substrate and configured to define said at least one of said front chamber and said back chamber.

17. The assembly according to claim 16, wherein said package is a top-port package and said casing has an opening defining an access port configured to enable entry of said acoustic pressure wave; said casing contributing to define said front chamber.

18. An electronic device, comprising;
 a central processing unit; and
 a microelectromechanical acoustic transducer assembly that includes:
  a microelectromechanical system (MEMS) sensing structure including a sensing capacitor that includes:
   a rigid electrode; and
   a membrane integrated in a first die of semiconductor material, the membrane having a first surface in fluid communication with a front chamber and a second surface, opposite to the first surface, in fluid communication with a back chamber, said membrane being configured to undergo deformation as a function of incident acoustic-pressure waves from said front chamber, and facing the rigid electrode, the sensing capacitor having capacitance that varies as a function of the deformation of said membrane;
  an electronic circuit integrated in a second die of semiconductor material, operatively coupled to said MEMS sensing structure, and configured to supply an electrical output signal as a function of the capacitive variation of said sensing capacitor; and
  a package configured to house said first die and said second die and including a base substrate carrying electrical contacts for connection of said microelectromechanical acoustic transducer assembly externally, wherein:
   said first die and said second die are stacked on one another in said package and are directly connected together mechanically and electrically,
   said package directly delimits a first side at least one of said front chamber and said back chamber and the membrane delimits a second side of the at least one of said front chamber and said back chamber,
   said first die includes a substrate having an active surface at which said membrane is arranged, and a rear surface starting from which the back chamber extends, through said substrate to said membrane; and
   said second die is stacked on said first die and has a facing surface facing said active surface of said first die so as to be arranged over said membrane.

19. The electronic device according to claim 18, wherein said electronic device is one of: a mobile phone, a PDA, a notebook, a voice recorder, an audio reader with voice-recorder functions, a console for videogames, a hydrophone.

20. The electronic device according to claim 18, wherein said package has an access port configured to enable entry of said acoustic pressure waves, and wherein said second die includes a plurality of through holes in fluid communication with said access port and said membrane, and arranged in such a way as to define a mechanical filter with respect to impurities entering the assembly through the access port.

21. A process for manufacturing a microelectromechanical acoustic transducer assembly, comprising:
 forming a microelectromechanical system (MEMS) sensing structure having a sensing capacitor that includes a rigid electrode and a membrane integrated in a first die of semiconductor material, the membrane having a first surface in fluid communication with a front chamber and a second surface, opposite to the first surface, in fluid communication with a back chamber of said microelectromechanical acoustic transducer assembly, said membrane being configured to undergo deformation as a function of incident acoustic-pressure waves from said front chamber, and facing the rigid electrode, the sensing capacitor having capacitance varying with the deformation of said membrane;
 forming, in a second die of semiconductor material, an electronic circuit operatively coupled to said MEMS sensing structure, and configured to supply an electrical output signal as a function of the capacitive variation of said sensing capacitor;
 forming a package configured to house said first die and said second die, and comprising a base substrate carrying electrical contacts configured to connect said microelectromechanical acoustic transducer assembly externally; and
 coupling said first die and said second die so that they are stacked on one another in said package and connected directly together mechanically and electrically, wherein forming the package comprises providing said package so that it delimits at least one between said front chamber and said back chamber of said microelectromechanical acoustic transducer, wherein:
  forming said MEMS sensing structure includes forming the membrane in an active surface of a substrate of the first die and forming the back chamber starting from a rear surface of the substrate and extending through said substrate to said membrane; and
  forming said second die includes stacking said second die on said first die and arranging a facing surface of the second die to face said active surface of said first die extend over said membrane.

22. The method according to claim 21, wherein said coupling is executed after forming said MEMS sensing structure in said first die and said electronic circuit in said second die.

23. The method according to claim 21, comprising forming a through hole through said second die by chemical etching, after forming said electronic circuit in said second die.

24. A microelectromechanical acoustic transducer assembly, comprising:
a microelectromechanical system (MEMS) sensing structure including a sensing capacitor that includes:
a rigid electrode; and
a membrane facing the rigid electrode and having a first surface in fluid communication with a front chamber and a second surface, opposite to the first surface, in fluid communication with a back chamber, said membrane being configured to undergo deformation as a function of incident acoustic-pressure waves from said front chamber, and being configured to have a capacitance that varies as a function of the deformation of said membrane;
a first die of semiconductor material;
an electronic circuit integrated in a second die of semiconductor material, operatively coupled to said MEMS sensing structure, and configured to supply an electrical output signal as a function of the capacitive variation of said sensing capacitor, wherein said first die and said second die are stacked on one another and are directly connected together mechanically and electrically; and
a base substrate on which the first and second dies are stacked, wherein said base substrate directly delimits a first side at least one of said front chamber and said back chamber and the membrane delimits a second side of the at least one of said front chamber and said back chamber, wherein:
said first die includes a substrate having an active surface at which said membrane is arranged, and a rear surface starting from which the back chamber extends, through said substrate to said membrane; and
said second die is stacked on said first die and has a facing surface facing said active surface of said first die so as to be arranged over said membrane.

25. The assembly according to claim 24, wherein the membrane is integrated in the first die of semiconductor material.

26. The assembly according to claim 24, further comprising:
bumps of conductive material configured to mechanically and electrically couple the first die with the second die and contribute to define an empty space above said membrane; and
a closing ring of conductive material set between said first die and said second die and surrounding said membrane, the closing ring being configured to hermetically close said empty space.

27. The assembly according to claim 24, wherein the first side is a bottom side of said back chamber and the second side is a top side of the back chamber.

28. The assembly according to claim 24, wherein said base substrate has an access port configured to enable entry of said acoustic pressure waves.

29. The assembly according to claim 24, wherein said base substrate includes an outer surface, opposite to a surface for coupling with said first die and said second die, the assembly further comprising:
electrical contact pads positioned on the outer surface of the base substrate and configured to connect to an external electrical circuit board, and
through electrical connections extending through the base substrate and configured to enable electrical connection of said first die and/or said second die to said electrical contact pads.

30. A microelectromechanical acoustic transducer assembly, comprising:
a microelectromechanical system (MEMS) sensing structure including a sensing capacitor that includes:
a rigid electrode; and
a membrane integrated in a first die of semiconductor material, the membrane having a first surface in fluid communication with a front chamber and a second surface, opposite to the first surface, in fluid communication with a back chamber, said membrane being configured to undergo deformation as a function of incident acoustic-pressure waves from said front chamber, and facing the rigid electrode, the sensing capacitor having capacitance that varies as a function of the deformation of said membrane;
an electronic circuit integrated in a second die of semiconductor material, operatively coupled to said MEMS sensing structure, and configured to supply an electrical output signal as a function of the capacitive variation of said sensing capacitor; and
a package configured to house said first die and said second die and including a base substrate carrying electrical contacts for connection of said microelectromechanical acoustic transducer assembly externally, wherein:
said first die and said second die are stacked on one another in said package and are directly connected together mechanically and electrically,
said package directly delimits a first side at least one of said front chamber and said back chamber and the membrane delimits a second side of the at least one of said front chamber and said back chamber,
said second die has a through hole configured to enable entry of said acoustic pressure waves, and in fluid communication with said membrane, and
said second die comprises a silicon-on-insulator (SOI) wafer, and said through hole is provided through an active layer of said SOI wafer; said second die having, in a position corresponding to said through hole, a cavity provided through an intermediate insulating layer and a base layer of said SOI wafer.

31. The assembly according to claim 30, wherein:
said package is a substrate-level package and comprises a coating set on said base substrate and laterally surrounding said first die and said second die; and
said through hole defines an external access port.

32. The assembly according to claim 30, wherein said package has a casing coupled to said base substrate and configured to define said at least one of said front chamber and said back chamber.

* * * * *